United States Patent
Chakrabarti et al.

(10) Patent No.: US 6,317,444 B1
(45) Date of Patent: *Nov. 13, 2001

(54) OPTICAL DEVICE INCLUDING CARBON-DOPED CONTACT LAYERS

(75) Inventors: Utpal Kumar Chakrabarti, Allentown, PA (US); Robert Alan Hamm, Staten Island, NY (US); Joseph Brian Seiler, Penn Township, Berks County, PA (US); Gleb E. Shtengel, Upper Milford Township, Lehigh County, PA (US); Lawrence Edwin Smith, Macungie, PA (US)

(73) Assignee: Agere System Optoelectronics Guardian Corp., Orlando, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/097,205

(22) Filed: Jun. 12, 1998

(51) Int. Cl.$^7$ ........................................... H01S 5/00
(52) U.S. Cl. ................................. 372/45; 372/50
(58) Field of Search .................. 385/131, 132, 385/142, 144; 372/45, 46, 50; 257/101–102

(56) References Cited

U.S. PATENT DOCUMENTS

| 5,212,703 | * | 5/1993 | Kahen ........................... 372/46 |
| 5,706,306 | * | 1/1998 | Jiang et al. ..................... 372/96 |
| 5,719,893 |   | 2/1998 | Jiang et al. ..................... 372/45 |
| 5,818,861 | * | 10/1998 | Tan et al. ...................... 372/46 |

FOREIGN PATENT DOCUMENTS

| 0726483A | 8/1996 | (EP) | ............. G02F/1/025 |
| 61258487A | 11/1986 | (JP) | ............. H01S/3/18 |
| 01214190A | 8/1989 | (JP) | ............. H01S/3/18 |
| 05198895 | 8/1993 | (JP) | ............. H01S/3/18 |
| 10135567A | 5/1998 | (JP) | ............. H01S/3/18 |

OTHER PUBLICATIONS

Schneider, J. M. et al: "Highly carbon–doped Ga0.47In0.53As contact layers grown by using carbontetrabromide in MBE on MOVPE . . . ", Journal of Crystal Growth, vol. 188, Jun. 1, 1998, pp. 56–62.

Ito, H. et al.: "Influence Of Gallium Sources On Carbon Incorporation Efficiency Into InGaAs Grown By Metalorganic Chemical Vapor Deposition", Journal of Crystal Growth, vol. 165, Aug. 1, 1996, pp. 215–221.

Botez, D. et al.: "66% CW Wallplug Efficiency From AL–Free 0.98 $\mu$m–Emitting Diode Lasers", Electronics Letters, vol. 32, Vo. 21, Oct. 10, 1996, pp. 2012/2013.

"High–Speed Integrated Electroabsorption Modulators", John E. Johnson et al., Procedings of SPIE, High–Speed Semiconductor Lasers for Communication, Feb. 10–11, 1997, San Jose, California, vol. 3038, pp. 30–38.

"Novel Structure MQW Electroabsorption Modulator/DFB–Laser Integrated Device Fabricated By Selective Area MOCVD Growth", M. Aoki et al., Electronics Letters, 7th Nov. 1991, vol. 27, No. 23, pp. 2138–2140.

"Growth and Characterization of High Yield Reliable, High–Power, High Speed, InP/GaAsP Capped Mesa Buried Heterostructure Distributed Feedback (CMBH–DFB) Laser", J. Zilko et al., IEEE Journal of Quantum Electronics, vol. 25, No. 10, Oct. 1989, pp. 2091–2095.

* cited by examiner

*Primary Examiner*—Quyen P. Leung
(74) *Attorney, Agent, or Firm*—Lester H. Birnbaum

(57) ABSTRACT

The invention is an optical device and method of fabrication which mitigates the problem of Zn migration in the cladding and waveguide regions. The contact region includes carbon, which acts as a p-type dopant in ternary semiconductor material. The contact layer is made of InGaAs or InGaAsP, and the invention is most advantageously used in an electroabsorption modulated laser or capped mesa buried heterostructure laser.

8 Claims, 2 Drawing Sheets

OPTICAL DEVICE INCLUDING CARBON-DOPED CONTACT LAYERS

BACKGROUND OF THE INVENTION

This invention relates to semiconductor optical devices, including lasers and electroabsorption modulators, and detectors.

Electroabsorption modulated laser (EML) devices have recently received a great deal of attention for use in high speed optical systems. Such devices typically include a semiconductor laser and modulator found in a single substrate. These devices usually include a semiconductor multi quantum well (MQW) active region, a contact layer formed thereover to facilitate electrical contact with the active layer, a current blocking layer for directing current to the active region, and a cladding layer to confine light to the active region. Zn is a commonly used p-type dopant for the blocking, contact and cladding layers, and the performance of the laser and modulator depends critically on the level of Zn in the various layers of the device.

It is desired to maintain a certain Zn dopant profile in the device structure for optimum performance. However, the Zn profile in the blocking and cladding layers may get modified during the growth of the contact layer due to the migration of the Zn dopant from the contact layer. One solution to the problem is to reduce the amount of Zn in the cladding, blocking, and contact layers. However, this approach also adversely affects other device properties, such as total device resistance.

It is desirable, therefore, to provide a process and resulting device which mitigate the problem of Zn migration in optical devices.

SUMMARY OF THE INVENTION

The invention in accordance with one aspect is an optical device comprising a semiconductor waveguide region (which may include an active region), a cladding region including a dopant comprising Zn, formed adjacent to the waveguide region, and a semiconductor contact region. The contact region is selected from the materials InGaAs and InGaAsP, and is formed over the waveguide region. The contact region includes a p-type dopant comprising carbon to provide sufficient conductivity to make low resistance contact to the waveguide region.

In accordance with another aspect, the invention is a method of fabricating an optical device including the steps of epitaxially forming a semiconductor waveguide region over the substrate, and forming a cladding region adjacent to the waveguide region, the cladding region including a dopant comprising Zn. A contact region selected from the materials InGaAs and InGaAsP is epitaxially formed over the waveguide region. The contact layer includes a p-type dopant comprising carbon to provide sufficient conductivity to make a low resistance contact to the waveguide region.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
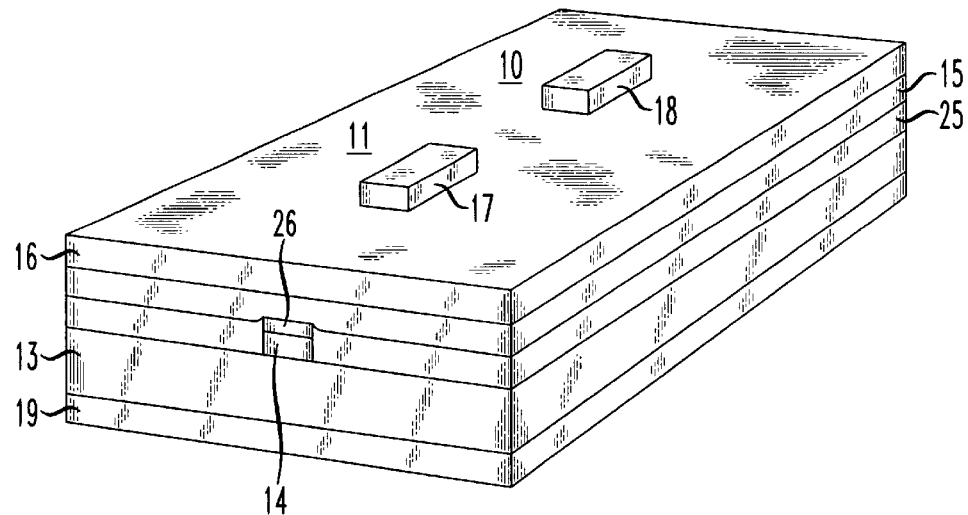
FIG. 1 is perspective view of an optical device according to one embodiment of the invention.

FIG. 1 illustrates a typical electroabsorption modulated laser (EML) device, 10, which includes features of the invention. The device, 10, basically comprises two portions, a laser portion, 11, and a modulator portion, 12, formed on a single substrate, 13. The substrate, 13, typically comprises InP. Formed on the substrate, 13, is a waveguide region, 14, which comprises a combination of active layer and optical confinement layer and is typically InGaAsP. The region, 14, includes a p-n junction, 26. As known in the art, the properties of the constituents of the waveguide 14 are chosen so that in the laser portion, 11, the waveguide will function as an active region and in the modulator portion, 12, the waveguide will absorb a certain amount of the emitted light depending upon the electrical bias supplied thereto. (See, e.g., Johnson et al "High Speed Integrated Electroabsorption Modulators", Proceedings of SPIE, Vol. 3038, pp. 30–38 (February 1997).

Thus, in the context of this application, a "waveguide" region refers to a region which will confine light to a designated portion of the device, and can include, alone or in combination, an active region, a modulator region, and a detector region (not shown).

A blocking layer, 25, is formed adjacent to the waveguide 14. This layer typically comprises alternate n-type, p-type and intrinsic layers of InP, and is used to block current in areas outside the waveguide 14.

A cladding layer, 15, is also formed adjacent to the waveguide, 14, and extending above it. The layer, 15, in combination with 14, provides the necessary structure for proper operation of an optical waveguide. The layer, 15, is typically a binary material, e.g., InP. The cladding layer typically includes Zn as a p-type dopant in a controlled profile. A contact layer, 16, is formed over the waveguide and cladding region. This layer is doped to provide sufficient conductivity to make low resistance contact to the section, 14. The layer, 16, typically comprises InGaAs and includes a p-type dopant to adjust the conductivity. In accordance with a preferred embodiment, the impurity is carbon, and the impurity concentration is within the range $1\times10^{18}$–$5\times10^{19}$ $cm^{-3}$. Carbon behaves as a p-type dopant in ternary material, although it acts as n-type dopant in other material such as InP. The elimination of Zn dopant in the contact layer, 16, effectively eliminates the problems associated with Zn migration during growth and processing, such as an increase in internal loss in the waveguide, 14, in the laser portion. In addition, it aids in preserving the location of p-n junction, 26, within section 14.

The device, 10, also includes electrodes 17 and 18 formed on the contact layer, 16, in the laser and modulator portions, 11 and 12, respectively and an electrode, 19, formed on the bottom surface of the substrate, 13. These electrodes provide the bias to produce light emission in the laser portion, 11, and control the absorption of the emitted light in the modulator portion, 12.

Figure 2:
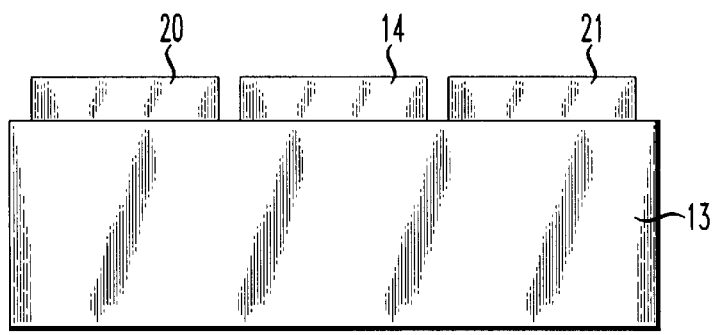
FIGS. 2–4 are views of the device of FIG. 1 during various stages of fabrication.
Figure 3:
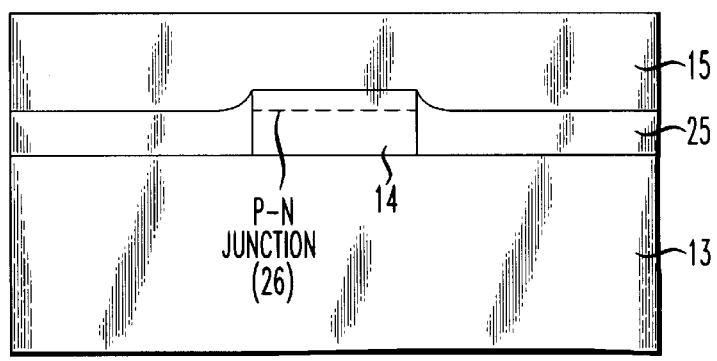
Figure 4:
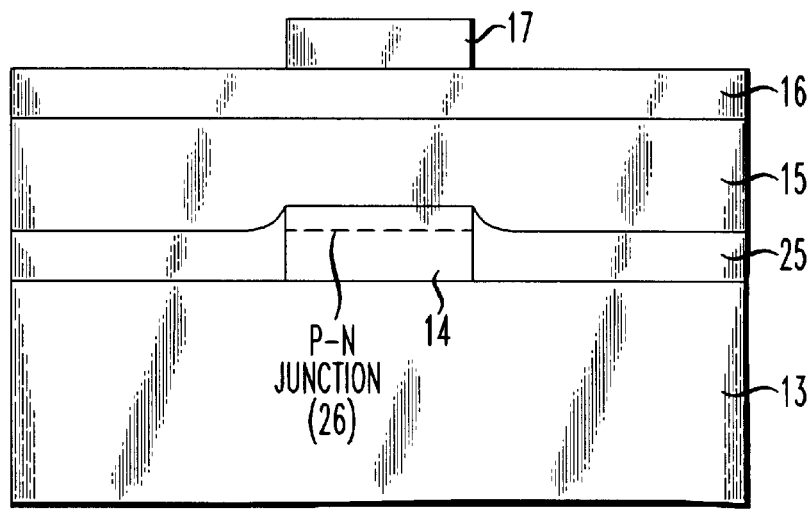

A method for fabricating the device of FIG. 1 is illustrated in FIGS. 2–4. As illustrated in FIG. 2, the region, 14, is formed on the substrate, 13, by first forming mask segments, 20 and 21, which arc typically $SiO_2$ and leaving a central portion of the substrate exposed. The region 14 is then grown on the exposed surface typically by metalorganic chemical vapor deposition (MOCVD) or gas source molecular beam epitaxy (GSMBE).

Typically, segments 20 and 21 are then removed, another SiO$_2$ mask (not shown) is formed on the region, 14, and then the region is etched to form a mesa structure.

As illustrated in FIG. 3, the blocking layer 25 and cladding layer, 15, are then formed by epitaxially growing the semiconductor layers on the exposed surfaces of the substrate, 13. This is usually done by MOCVD. The layer, 15, typically includes a Zn dopant having a desired profile as a function of the layer thickness so as to form the p-n junction. For example, the concentration of Zn dopant usually varies from $5 \times 10^{17}$ cm$^3$ to $3 \times 10^{18}$ cm$^3$.

As illustrated in FIG. 4, the contact layer, 16, is formed on the cladding layer, 15, typically by MOCVD. The layer, 16, includes carbon as a p-type dopant to provide the desired conductivity. Preferably, the dopant concentration is in the range $1 \times 10^{18} - 5 \times 10^{19}$ cm$^{-3}$. The contact layer, 16, is typically InGaAs, but other materials such as InGaAsP might be employed if carbon will act as a p-type dopant therein. The layer 16, is typically 0.1 μm–0.5 μm micron thick.

The structure is completed by depositing electrodes 17, 18 and 19 on the top and bottom surfaces, respectively, of the device. These electrodes are typically Ti/Pt/Au or Be-Au and deposited by e-beam evaporation.

Figure 5:
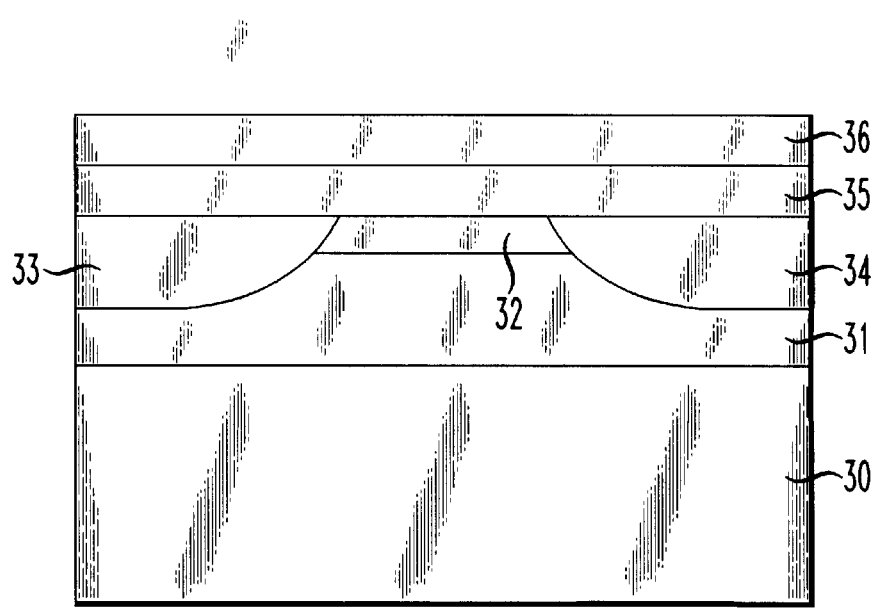
FIG. 5 is a front view of a device according to a further embodiment of the invention.

While the invention has been described with reference to an EML device, it should be apparent that it is useful for other optical devices requiring a p-type contact layer. For example, a capped Mesa Buried Heterostructure (CMBH) laser, illustrated in FIG. 5, includes a substrate, 30, typically InP on which is formed a n-type lower cladding layer 31, an active region and waveguide, 32, for light emission, and blocking regions, 33 and 34, adjacent to the active region, layer 35. The active region typically comprises MQW or bulk layers of InGaAsP, and the blocking regions, 33 and 34, typically comprise InP. A p-type cladding layer, 35, comprising typically InP was formed over the waveguide and active region. This was followed by the growth of layer 36 as a contact layer. The contact layer, 36, was InGaAs and includes carbon as the p-type dopant with a concentration in the range $1 \times 10^{18} - 5 \times 10^{19}$ cm$^{-3}$.

This device was tested, and it was discovered that such lasers have lower threshold currents and higher slope efficiency than similar devices made with Zn-doped contact layers. Further, the internal loss in the laser cavity was lower for devices made in accordance with the invention as a result of the absence of Zn diffusion into the active region.

What is claimed is:

1. An optical device comprising:

a semiconductor waveguide region including an active region a cladding region including a dopant comprising Zn formed adjacent to the waveguide region; and adapted to provide waveguiding of light in the active region; and a semiconductor contact region selected from InGaAs and InGaAsP formed over the waveguide region, the contact region including a p-type dopant comprising carbon to provide sufficient conductivity to make low resistance contact with the waveguide region.

2. The device according to claim 1 wherein the concentration of the p-type carbon dopant is within the range $1 \times 10^{18} - 5 \times 10^{19}$ cm$^{-3}$.

3. The device according to claim 1 wherein the device is an electroabsorpition modulated laser.

4. The device according to claim 1 wherein the device is a Capped Mesa buried heterostructure laser.

5. The device according to claim 1 wherein the waveguide region further comprises a modulator region and the cladding region is adapted to provide waveguiding of light between the active region and the modulator region.

6. A method for fabricating an optical device comprising the steps of:

epitaxially forming a semiconductor waveguide region over a substrate;

forming a cladding region adjacent to said waveguide region, the cladding region including a dopant comprising Zn; and epitaxially forming a contact region selected from InGaAs and InGaAsP over the waveguide region, the contact region including a p-type dopant comprising carbon to provide a sufficient conductivity to make low resistance contact to the waveguide region.

7. The method according to claim 6 wherein the concentration of the p-type carbon dopant is within the range $1 \times 10^{18} - 5 \times 10^{19}$ cm$^{-3}$.

8. The method according to claim 6 wherein the contact region is formed by metallorganic chemical vapor deposition.

\* \* \* \* \*